United States Patent
Sasamoto et al.

(10) Patent No.: US 10,372,030 B2
(45) Date of Patent: Aug. 6, 2019

(54) HALFTONE PHASE SHIFT MASK BLANK AND HALFTONE PHASE SHIFT MASK

(71) Applicant: Shin-Etsu Chemical Co., Ltd., Tokyo (JP)

(72) Inventors: Kouhei Sasamoto, Joetsu (JP); Takuro Kosaka, Joetsu (JP); Yukio Inazuki, Joetsu (JP); Hideo Kaneko, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/077,258

(22) Filed: Mar. 22, 2016

(65) Prior Publication Data

US 2016/0291452 A1    Oct. 6, 2016

(30) Foreign Application Priority Data

Mar. 31, 2015 (JP) .................................. 2015-072658

(51) Int. Cl.
*G03F 1/32* (2012.01)

(52) U.S. Cl.
CPC ..................... *G03F 1/32* (2013.01)

(58) Field of Classification Search
CPC .................... G03F 1/32; G03F 1/0076
USPC ............................................................ 430/5
See application file for complete search history.

(56) References Cited

U.S. PATENT DOCUMENTS

| | | | |
|---|---|---|---|
| 5,474,864 A | 12/1995 | Isao et al. | |
| 7,179,545 B2 | 2/2007 | Okazaki et al. | |
| 7,767,366 B2 | 8/2010 | Yoshikawa et al. | |
| 7,771,893 B2 | 8/2010 | Yoshikawa et al. | |
| 7,941,767 B2 | 5/2011 | Mukai et al. | |
| 2002/0122991 A1 | 9/2002 | Shiota et al. | |
| 2004/0072016 A1* | 4/2004 | Okazaki | G03F 1/32 428/689 |
| 2012/0064438 A1* | 3/2012 | Yoshikawa | G03F 1/32 430/5 |
| 2013/0309598 A1* | 11/2013 | Fukaya | G03F 1/29 430/5 |
| 2015/0338731 A1 | 11/2015 | Nozawa et al. | |
| 2016/0195803 A1 | 7/2016 | Adachi et al. | |

FOREIGN PATENT DOCUMENTS

| | | | |
|---|---|---|---|
| JP | 7-140635 A | 6/1995 | |
| JP | 2003-201559 A | 7/2003 | |
| JP | 2004-133029 A | 4/2004 | |
| JP | 2007-33469 A | 2/2007 | |
| JP | 2007-233179 A | 9/2007 | |
| JP | 2007-241065 A | 9/2007 | |
| JP | 2007-241137 A | 9/2007 | |
| JP | 2008-276002 A | 11/2008 | |
| JP | 2014-137388 A | 7/2014 | |
| JP | 5823655 * | 10/2015 | ............... G03F 1/32 |
| WO | WO 2015/025922 A1 | 2/2015 | |

OTHER PUBLICATIONS

Machine Translation of Japanese Patent Publication No. JP-5823655, Part I, Hoya, Oct. 2015 (Year: 2015).*
Machine Translation of Japanese Patent Publication No. JP-5823655, Part II, Hoya, Oct. 2015 (Year: 2015).*
Faure et al. "Characterization of Binary and Attenuated Phase Shift Mask Blanks for 32nm Mask Fabrication", Proc. of SPIE, vol. 7122, pp. 712209-1 to 712209-12, (2008).
Extended European Search Report dated Nov. 16, 2016, in European Patent Application No. 16161049.8.
Japanese Office Action issued in the corresponding Japanese Patent Application No. 2015-072658 dated Nov. 21, 2017.
Japanese Office Action (including an English translation thereof) issued in the corresponding Japanese Patent Application No. 2018-089061 dated May 14, 2019.

* cited by examiner

*Primary Examiner* — Daborah Chacko-Davis
(74) *Attorney, Agent, or Firm* — Birch, Stewart, Kolasch & Birch, LLP

(57) ABSTRACT

A halftone phase shift mask blank is provided comprising a transparent substrate and a halftone phase shift film which is composed of a silicon base material having a Si+N+O content of at least 90 at %, a Si content of 30-70 at %, a N+O content of 30-60 at %, and an O content of up to 30 at %, and has a thickness of up to 70 nm. The halftone phase shift film is thin enough for mask pattern processing, undergoes minimal pattern size variation degradation upon exposure to sub-200 nm radiation, and maintains a necessary phase shift and transmittance.

21 Claims, 2 Drawing Sheets

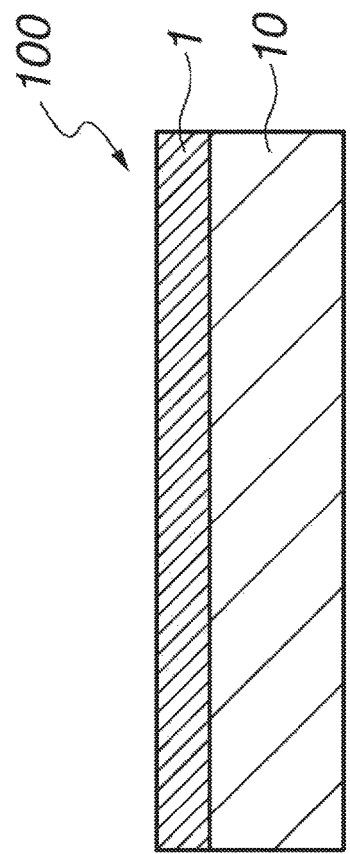
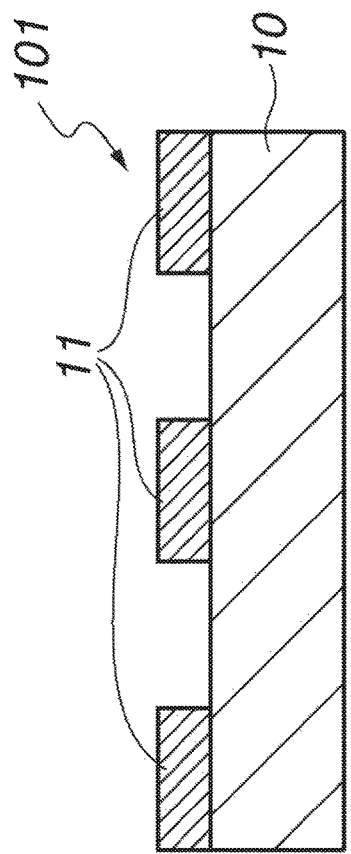

HALFTONE PHASE SHIFT MASK BLANK AND HALFTONE PHASE SHIFT MASK

CROSS-REFERENCE TO RELATED APPLICATION

This non-provisional application claims priority under 35 U.S.C. § 119(a) on Patent Application No. 2015-072658 filed in Japan on Mar. 31, 2015, the entire contents of which are hereby incorporated by reference.

TECHNICAL FIELD

This invention relates to a halftone phase shift mask blank and a halftone phase shift mask for use in the microfabrication of semiconductor integrated circuits or the like.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing optical interference. One of the photomasks adapted for the phase shift method is a halftone phase shift mask. Typically, the halftone phase shift mask includes a substrate of quartz or similar material which is transparent to exposure light, and a mask pattern of halftone phase shift film formed on the substrate, capable of providing a phase shift of approximately 180 degrees and having an insufficient transmittance to contribute to pattern formation. As the halftone phase shift mask, Patent Document 1 (JP-A H07-140635) proposes a mask having a halftone phase shift film of molybdenum silicide oxide (MoSiO) or molybdenum silicide oxynitride (MoSiON).

For the purpose of forming finer images by photolithography, light of shorter wavelength is used as the light source. In the currently most advanced stage of lithography process, the exposure light source has made a transition from KrF excimer laser (248 nm) to ArF excimer laser (193 nm). The lithography using ArF excimer laser light of greater energy was found to cause damages to the mask, which were not observed with KrF excimer laser light. One problem is that on continuous use of the photomask, foreign matter-like growth defects form on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. With respect to the growth defects formed on the photomask upon long-term irradiation of ArF excimer laser light, for example, Patent Document 2 (JP-A 2008-276002) describes that if the photomask is cleaned at a predetermined stage, then it can be continuously used.

As the exposure dose of ArF excimer laser light irradiated for pattern transfer increases, the photomask is given damage different from haze; and the size of the mask pattern changes in accordance with the cumulative irradiation energy dose, as reported in Non-Patent Document 1 (Thomas Faure et al., "Characterization of binary and attenuated phase shift mask blanks for 32 nm mask fabrication," Proc. of SPIE, vol. 7122, pp 712209-1 to 712209-12). This problem is that as the cumulative irradiation energy dose increases during long-term irradiation of ArF excimer laser light, a layer of a substance which is considered to be an oxide of the pattern material grows outside the film pattern, whereby the pattern width changes. It is also reported that the mask once damaged cannot be restored by cleaning with AMP (aqueous ammonia/hydrogen peroxide) as used in the above-mentioned haze removal or with SPM (sulfuric acid/hydrogen peroxide). It is believed that the damage source is utterly different.

Non-Patent Document 1 points out that upon exposure of a circuit pattern through a halftone phase shift mask which is the mask technology useful in expanding the depth of focus, substantial degradation is induced by pattern size variation resulting from alteration of a transition metal/silicon base material film such as MoSi base material film by irradiation of ArF excimer laser light (this degradation is referred to as "pattern size variation degradation"). Then, in order to use an expensive photomask over a long period of time, it is necessary to address the pattern size variation degradation by irradiation of ArF excimer laser light.

CITATION LIST

Patent Document 1: JP-A H07-140635
Patent Document 2: JP-A 2008-276002 (U.S. Pat. No. 7,941,767)
Patent Document 3: JP-A 2004-133029
Patent Document 4: JP-A 2007-033469
Patent Document 5: JP-A 2007-233179
Patent Document 6: JP-A 2007-241065

Non-Patent Document 1: Thomas Faure et al., "Characterization of binary and attenuated phase shift mask blanks for 32 nm mask fabrication," Proc. of SPIE, vol. 7122, pp 712209-1 to 712209-12

SUMMARY OF INVENTION

With respect to the phase shift film, a thinner film is advantageous for pattern formation and effective for reducing 3D effect. Thus a thinner film is required in order for photolithography to form a finer size pattern.

As pointed out in Non-Patent Document 1, the pattern size variation degradation by irradiation of short wavelength light, typically ArF excimer laser light does scarcely occur when light is irradiated in a dry air atmosphere. Exposure in a dry air atmosphere is regarded as a new approach for inhibiting the pattern size variation degradation. However, the control of a dry air atmosphere adds an extra unit to the exposure system and gives rise to electrostatic and other problems to be managed, leading to an increased expense. Under the circumstances, it is necessary to enable long-term exposure in a common atmosphere that does not need complete removal of humidity (typically having a humidity of around 45%).

The photomasks used in the lithography using ArF excimer laser light as light source include halftone phase shift masks having a halftone phase shift film of a silicon base material containing a transition metal, typically molybdenum. This silicon base material is mainly composed of a transition metal and silicon, and further contains oxygen and/or nitrogen as light element (e.g., Patent Document 1). Suitable transition metals used include Mo, Zr, Ta, W, and Ti. Among others, Mo is most often used (e.g., Patent Document 1). Sometimes a second transition metal is added (e.g., Patent Document 3). For the light-shielding film, silicon base materials containing a transition metal, typically molybdenum are also used. However, when a photomask using such transition metal-containing silicon base material is exposed to a large dose of high-energy radiation, the mask undergoes significant pattern size variation degradation by irradiation of high-energy radiation. Then the service lifetime of the photomask is shorter than the requirement.

It is a serious problem that when a photomask pattern on a halftone phase shift mask is irradiated with short-wavelength light, typically ArF excimer laser light, the photomask pattern for exposure experiences a variation of line width, that is, "pattern size variation degradation." The permissible threshold of pattern width differs with the type of photomask pattern, especially the pattern rule applied thereto. If variations are small, the mask may be further used by correcting the exposure conditions and resetting the irradiation conditions of an exposure system. For example, in the lithography for forming semiconductor circuits complying with the pattern rule of 22 nm, the variation of mask pattern line width must fall within approximately ±5 nm. However, if a pattern width variation is large, there is a possibility that the variation has an in-plane distribution on the photomask. Also in the further miniaturization technology, an auxiliary pattern having an ultrafine size of less than 100 nm is formed on the mask. For the purpose of pattern miniaturization on these masks and from the aspect of an increase of mask processing cost by complication of mask pattern, there is a need for a halftone phase shift mask film which experiences minimal pattern size variation degradation and allows for repeated exposure.

An object of the invention is to provide a halftone phase shift mask blank and halftone phase shift mask having a halftone phase shift film which is thin enough to be advantageous for pattern formation and 3D effect reduction while maintaining a necessary phase shift and transmittance for the halftone phase shift function to comply with pattern size miniaturization, and which upon patternwise exposure using short high-energy radiation of wavelength up to 200 nm, typically ArF excimer laser light, even in the case of an increased cumulative irradiation energy dose, is minimized in pattern size variation degradation resulting from alteration of film property by light irradiation.

Aiming to develop a halftone phase shift film having a reduced thickness and minimized pattern size variation degradation upon exposure to ArF excimer laser light while maintaining a necessary phase shift and transmittance for the halftone phase shift function, the inventors made a study on a halftone phase shift film containing a transition metal, typically molybdenum which is commonly used as the halftone phase shift film. However, when a transition metal or oxygen is added to a halftone phase shift film, there arise problems that the refractive index of the film having a predetermined transmittance is reduced in proportion to the amount of transition metal or oxygen added, the film must be thick to gain a necessary phase shift for the phase shift function, and the pattern size variation degradation upon exposure to ArF excimer laser light is exacerbated.

Then a study was made on halftone phase shift films having a minimal content of transition metal. It has been found that using a silicon base material comprising essentially silicon and nitrogen and optionally oxygen, having a total content of silicon, nitrogen and oxygen of at least 90 at %, a silicon content of 30 to 70 at %, a total content of nitrogen and oxygen of 30 to 60 at %, an oxygen content of up to 30 at %, and a transition metal content of up to 1 at %, a halftone phase shift film having a phase shift of 150° to 200° and a transmittance of 3% to 30% with respect to light of wavelength up to 200 nm can be formed to a thickness of up to 70 nm.

When exposed to short high-energy radiation of sub-200 nm wavelength, typically ArF excimer laser, the halftone phase shift film experiences minimized pattern size variation degradation. That is, the halftone phase shift film has improved resistance to film alteration by cumulative irradiation of short high-energy radiation of sub-200 nm wavelength, typically ArF excimer laser. Once the halftone phase shift film is constructed as above, there is obtained a halftone phase shift mask blank which can be advantageously processed into a halftone phase shift mask having a pattern of halftone phase shift film including a main photomask pattern with a width of about 100 to 200 nm, which is necessary in photolithography for forming a pattern with a half pitch of up to 50 nm on a processable substrate such as silicon wafer, using exposure light of wavelength up to 200 nm, the halftone phase shift mask undergoing little pattern size variation degradation upon exposure.

Accordingly, in one aspect, the invention provides a halftone phase shift mask blank comprising a transparent substrate and a halftone phase shift film thereon having a phase shift of 150° to 200° and a transmittance of 3% to 30% with respect to light of wavelength up to 200 nm. The halftone phase shift film is a single layer or a multilayer film, each layer comprising essentially silicon and nitrogen and optionally oxygen, when the halftone phase shift film is a single layer, the overall single layer is composed of a silicon base material, or when the halftone phase shift film is a multilayer film, at least 60% of its thickness is composed of a silicon base material, said silicon base material having a total content of silicon, nitrogen and oxygen of at least 90 at %, a silicon content of 30 to 70 at %, a total content of nitrogen and oxygen of 30 to 60 at %, an oxygen content of up to 30 at %, and a transition metal content of up to 1 at %. The halftone phase shift film has a thickness of up to 70 nm.

In a preferred embodiment, the halftone phase shift film has a transmittance of 20% to 30%, and said silicon base material contains oxygen and has a total content of silicon, nitrogen and oxygen of at least 95 at %.

In another preferred embodiment, the halftone phase shift film has a transmittance of 3% to less than 20%, and said silicon base material is free of oxygen and has a total content of silicon and nitrogen of at least 95 at %.

In a preferred embodiment, the mask blank further comprises a second film on the halftone phase shift film, the second film being a single layer or a multilayer film composed of a chromium-containing material. Preferably, the second film is a light-shielding film, a combination of light-shielding film and antireflective film, or an auxiliary film which functions as a hard mask during pattern formation of the halftone phase shift film.

In a preferred embodiment, the mask blank further comprises a third film on the second film, the third film being a single layer or a multilayer film composed of a silicon-containing material. More preferably, the second film is a light-shielding film or a combination of light-shielding film and antireflective film, and the third film is an auxiliary film which functions as a hard mask during pattern formation of the second film. Also preferably, the second film is an auxiliary film which functions as a hard mask during pattern formation of the halftone phase shift film and as an etch stopper during pattern formation of the third film, and the third film is a light-shielding film or a combination of light-shielding film and antireflective film.

In a preferred embodiment, the mask blank further comprises a fourth film on the third film, the fourth film being a single layer or a multilayer film composed of a chromium-containing material. More preferably, the second film is an auxiliary film which functions as a hard mask during pattern formation of the halftone phase shift film and as an etch stopper during pattern formation of the third film, the third film is a light-shielding film or a combination of light-shielding film and antireflective film, and the fourth film is an auxiliary film which functions as a hard mask during pattern formation of the third film.

Also contemplated herein is a halftone phase shift mask prepared from the halftone phase shift mask blank defined above.

Advantageous Effects of Invention

The halftone phase shift mask blank or halftone phase shift mask of the invention has a halftone phase shift film which is thin enough to be advantageous for photomask pattern formation, undergoes minimized pattern size variation degradation upon exposure to radiation of sub-200 nm wavelength, and maintains a necessary phase shift for the phase shift function and a necessary transmittance for the halftone function. Using the halftone phase shift mask, lithography exposure complying with the requirements of pattern miniaturization and patterning accuracy becomes possible. The halftone phase shift mask experiences minimized pattern size variation degradation relative to a cumulative exposure dose, that is, has a long lifetime.

BRIEF DESCRIPTION OF DRAWINGS

FIGS. 1A and 1B are cross-sectional views of one exemplary halftone phase shift mask blank and a corresponding halftone phase shift mask of the invention, respectively.

DESCRIPTION OF PREFERRED EMBODIMENTS

Figure 2A:
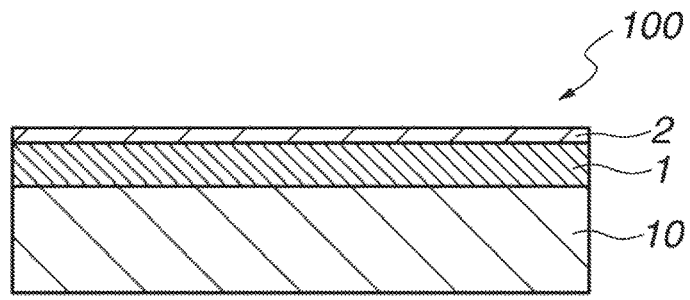
FIGS. 2A, 2B and 2C are cross-sectional views of further embodiments of the halftone phase shift mask blank of the invention.

The invention pertains to a halftone phase shift (photo) mask blank comprising a transparent substrate and a halftone phase shift film formed thereon. The transparent substrate is typically a quartz substrate. Preference is given to transparent substrates of 6 inch squares and 25 mil thick, known as 6025 substrate, as prescribed in the SEMI standards, or transparent substrates of 152 mm squares and 6.35 mm thick when expressed in the SI units. The halftone phase shift film may be a single layer structure or a multilayer structure (i.e., two or more layers). The halftone phase shift (photo)mask has a (photo)mask pattern of a halftone phase shift film.

FIG. 1A is a cross-sectional view of a halftone phase shift mask blank in one embodiment of the invention. The halftone phase shift mask blank 100 includes a transparent substrate 10 and a halftone phase shift film 1 formed thereon. FIG. 1B is a cross-sectional view of a halftone phase shift mask in one embodiment of the invention. The halftone phase shift mask 101 includes a transparent substrate 10 and a halftone phase shift film pattern 11 thereon.

The halftone phase shift film may be composed of a single layer or multiple layers as long as a phase shift and a transmittance necessary for the halftone phase shift function are met. In the case of multilayer structure, the film is preferably composed of multiple layers including an antireflective function layer so that the overall film may meet a predetermined surface reflectance as well as the necessary phase shift and transmittance.

In either of the single layer and multilayer structure, each layer may be a uniform layer or a compositionally graded layer (i.e., a layer whose composition varies continuously in thickness direction). In the case of multilayer structure, the halftone phase shift film may be a combination of two or more layers selected from layers composed of different constituents and layers composed of identical constituents in different compositional ratios. Where the film is composed of three or more layers, identical layers may be included as long as they are not contiguous to each other.

Since halftone phase shift masks are used in the photolithography using exposure light of wavelength up to 200 nm, typically ArF excimer laser light (wavelength 193 nm), the halftone phase shift film should provide a predetermined phase shift and a predetermined transmittance with respect to the exposure light at a predetermined thickness.

The (overall) thickness of the halftone phase shift film should preferably be up to 70 nm, more preferably up to 62 nm, because a thinner film facilitates to form a finer pattern. The lower limit of the film thickness is set in the range where the desired optical properties are obtained relative to light of wavelength up to 200 nm. Specifically, the film thickness is set at least 40 nm, though the lower limit is not critical.

The phase shift of the halftone phase shift film with respect to exposure light is such that a phase shift between the exposure light transmitted by a region of phase shift film (phase shift region) and the exposure light transmitted by a neighboring region where the phase shift film is removed, causes interference of exposure light at the boundary whereby contrast is increased. Specifically the phase shift is 150 to 200 degrees. Although ordinary halftone phase shift films are set to a phase shift of approximately 180°, it is possible from the standpoint of contrast enhancement to adjust the phase shift below or beyond 180°. For example, setting a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°, and most preferably approximately 180°.

The halftone phase shift film has a transmittance of exposure light which is preferably at least 3%, more preferably at least 5%, and up to 30%.

The halftone phase shift film should preferably have a refractive index n of at least 2.4, more preferably at least 2.5, and even more preferably at least 2.6 with respect to the exposure light as long as it meets an appropriate phase shift, transmittance and film thickness as defined above. By reducing the oxygen content of a halftone phase shift film, preferably by eliminating oxygen from the film, or by reducing the transition metal content of a halftone phase shift film, preferably by eliminating transition metal from the film, the refractive index n of the film can be increased. Also, the thickness of the film can be reduced while maintaining the necessary phase shift for the phase shift function. Moreover, the pattern size variation degradation with respect to irradiation of light of wavelength up to 200 nm is suppressed. The refractive index n becomes higher as the oxygen content is lower, and the necessary phase shift is available from a thinner film as the refractive index n is higher. When the halftone phase shift film is a single layer, this single layer should preferably have a refractive index n of at least 2.4, more preferably at least 2.5 and even more preferably at least 2.6. When the halftone phase shift film is a multilayer film, at least 60% of the overall thickness should preferably have a refractive index n of at least 2.4, more preferably at least 2.5 and even more preferably at least 2.6. A laminar portion of the multilayer film having a refractive index n in the range is preferably at least 70%, more preferably at least 80%, even more preferably at least 90%, and most preferably 100% of the overall thickness.

The halftone phase shift film should preferably have an extinction coefficient k of at least 0.4, especially at least 0.6 and up to 0.7, especially up to 0.65 with respect to exposure light as long as it meets an appropriate phase shift, transmittance and thickness as defined above. When the halftone phase shift film is a single layer, this single layer should preferably have an extinction coefficient k of at least 0.4, especially at least 0.6 and up to 0.7, especially up to 0.65. When the halftone phase shift film is a multilayer film, at least 60% of the overall thickness should preferably have an extinction coefficient k of at least 0.1, especially at least 0.2 and up to 0.7, especially up to 0.65. A laminar portion of the multilayer film having an extinction coefficient k in the range is preferably at least 70%, more preferably at least 80%, even more preferably at least 90%, and most preferably 100% of the overall thickness.

The halftone phase shift film consists of a single layer or a plurality of layers, each composed of a silicon base material. The silicon base material contains silicon and nitrogen as essential components and oxygen as an optional component. Elements other than these are permissible as long as their amount is at an impurity level. Preferably, the content of transition metals such as molybdenum, zirconium, tungsten, titanium, hafnium, chromium and tantalum is limited to 1 at % or less. More preferably, transition metals are not contained.

When the halftone phase shift film is a single layer, the overall single layer should be composed of a silicon base material having a total content of silicon, nitrogen and oxygen (total content of silicon and nitrogen if oxygen-free) of at least 90 at %, preferably at least 95 at %; or when the halftone phase shift film is a multilayer film, at least 60%, preferably at least 70%, more preferably at least 80%, even more preferably at least 90%, and most preferably 100% (i.e., overall film) of its thickness (excluding a surface oxidized layer if any) should be composed of a silicon base material having a total content of silicon, nitrogen and oxygen (total content of silicon and nitrogen if oxygen-free) of at least 90 at %, preferably at least 95 at %.

When the halftone phase shift film is a single layer, the overall single layer should be composed of a silicon base material, or when the halftone phase shift film is a multilayer film, at least 60%, preferably at least 70%, more preferably at least 80%, even more preferably at least 90%, and most preferably 100% (i.e., overall film) of its thickness (excluding a surface oxidized layer if any) should be composed of a silicon base material, the silicon base material having a silicon content of at least 30 at %, preferably at least 40 at %, and up to 70 at %, preferably up to 55 at %, and more preferably up to 50 at %. In particular, when the halftone phase shift film has a low transmittance of specifically from 3% to less than 20%, more specifically from 3% to 12%, and even more specifically from 3% to less than 10%, the silicon base material preferably has a silicon content of at least 40 at %, more preferably at least 44 at %, and up to 70 at %, more preferably up to 55 at %, and even more preferably up to 50 at %. When the halftone phase shift film has a high transmittance of specifically from 20% to 30%, the silicon base material preferably has a silicon content of at least 30 at %, more preferably at least 40 at %, and up to 55 at %, and more preferably up to 45 at %.

When the halftone phase shift film is a single layer, the overall single layer should be composed of a silicon base material, or when the halftone phase shift film is a multilayer film, at least 60%, preferably at least 70%, more preferably at least 80%, even more preferably at least 90%, and most preferably 100% (i.e., overall film) of its thickness (excluding a surface oxidized layer if any) should be composed of a silicon base material, the silicon base material having a total content of nitrogen and oxygen of at least 30 at %, preferably at least 45 at %, more preferably at least 50 at %, and up to 60 at %, preferably up to 55 at %.

When the halftone phase shift film is a single layer, the overall single layer should be composed of a silicon base material, or when the halftone phase shift film is a multilayer film, at least 60%, preferably at least 70%, more preferably at least 80%, even more preferably at least 90%, and most preferably 100% (i.e., overall film) of its thickness (excluding a surface oxidized layer if any) should be composed of a silicon base material, the silicon base material having a nitrogen content of preferably at least 10 at %, more preferably at least 40 at %, and preferably up to 60 at %, more preferably up to 55 at %. In particular, when the halftone phase shift film has a low transmittance of specifically from 3% to less than 20%, more specifically from 3% to 12%, and even more specifically from 3% to less than 10%, the silicon base material preferably has a nitrogen content of at least 40 at %, more preferably at least 44 at %, even more preferably at least 50 at %, and up to 60 at %, more preferably up to 56 at %. When the halftone phase shift film has a high transmittance of specifically from 20% to 30%, the silicon base material preferably has a nitrogen content of at least 10 at %, more preferably at least 40 at %, and up to 60 at %, and more preferably up to 55 at %.

When the halftone phase shift film is a single layer, the overall single layer should be composed of a silicon base material, or when the halftone phase shift film is a multilayer film, at least 60%, preferably at least 70%, more preferably at least 80%, even more preferably at least 90%, and most preferably 100% (i.e., overall film) of its thickness (excluding a surface oxidized layer if any) should be composed of a silicon base material, the silicon base material having an oxygen content of up to 30 at %, preferably up to 6 at %. In particular, when the halftone phase shift film has a high transmittance of specifically from 20% to 30%, the silicon base material preferably has a oxygen content of up to 30 at %, more preferably up to 25 at %. When the halftone phase shift film has a low transmittance of specifically from 3% to less than 20%, more specifically from 3% to 12%, and even more specifically from 3% to less than 10%, the silicon base material preferably has an oxygen content of up to 6 at %, more preferably up to 3.5 at %, and even more preferably up to 1 at %.

When the halftone phase shift film is a single layer, the overall single layer should be composed of a silicon base material, or when the halftone phase shift film is a multilayer film, at least 60%, preferably at least 70%, more preferably at least 80%, even more preferably at least 90%, and most preferably 100% (i.e., overall film) of its thickness (excluding a surface oxidized layer if any) should be composed of a silicon base material, the silicon base material having a transition metal content of up to 1 at %. Exemplary transition metals include molybdenum, zirconium, tungsten, titanium, hafnium, chromium and tantalum. The silicon base material may be free of a transition metal, or contain at least 0.01 at % of transition metal in order to improve the electric resistance of the film.

Suitable silicon base materials include a silicon base material consisting of silicon and nitrogen, i.e., silicon nitride (SiN) and a silicon base material consisting of silicon, nitrogen and oxygen, i.e., silicon oxynitride (SiON).

In one preferred embodiment, a halftone phase shift film is composed of a silicon base material containing silicon, nitrogen and oxygen, with a total content of silicon, nitrogen and oxygen being at least 95 at %, especially a silicon base material consisting of silicon, nitrogen and oxygen. Then the halftone phase shift film has a transmittance in the range of 20% to 30% and an appropriate phase shift and film thickness as defined above.

In order to form a halftone phase shift film as a thin film, a silicon base material with a lower oxygen content is preferred, with an oxygen-free material being more preferred. From this aspect, the halftone phase shift film should preferably be composed of an oxygen-free silicon base material. In this context, the halftone phase shift film is advantageously composed of a silicon base material containing silicon and nitrogen, but not oxygen, with a total content of silicon and nitrogen being at least 95 at %, especially a silicon base material consisting of silicon and nitrogen. Then the halftone phase shift film has a transmittance in the range of 3% to less than 20% and an appropriate phase shift and film thickness as defined above.

While the halftone phase shift film may be deposited by any well-known film-forming techniques, the sputtering technique is preferred because films of homogeneity are readily deposited. Either DC sputtering or RF sputtering may be employed. The target and sputtering gas may be selected as appropriate depending on the layer construction and composition of the film. Suitable targets include a silicon target, a silicon nitride target, and a target containing silicon and silicon nitride. The contents of nitrogen and oxygen may be adjusted during reactive sputtering by using nitrogen-containing gas, oxygen-containing gas, or nitrogen/oxygen-containing gas, and optionally carbon-containing gas, as the reactive gas, and adjusting the flow rate thereof. The reactive gas is, for example, nitrogen gas ($N_2$ gas), oxygen gas ($O_2$ gas), nitrogen oxide gases ($N_2O$ gas, NO gas, $NO_2$ gas). In the sputtering gas, a rare gas such as helium, neon or argon gas may also be used.

In the embodiment wherein the halftone phase shift film is a multilayer film, the film may include a surface oxidized layer as the outermost layer on the surface side (disposed remote from the substrate) in order to suppress any change in quality of the film. The surface oxidized layer may have an oxygen content of at least 20 at %, with even an oxygen content of at least 50 at % being acceptable. The surface oxidized layer may be formed by atmospheric or air oxidation or forced oxidative treatment. Examples of forced oxidative treatment include treatment of a silicon-based material film with ozone gas or ozone water, and heating of a film at about 300° C. in an oxygen-containing atmosphere, typically oxygen gas atmosphere by oven heating, lamp annealing or laser heating. The surface oxidized layer preferably has a thickness of up to 10 nm, more preferably up to 5 nm, and even more preferably up to 3 nm. The oxidized layer exerts its effect as long as its thickness is at least 1 nm. Although the surface oxidized layer may also be formed by increasing the amount of oxygen in the sputtering gas during the sputtering step, atmospheric oxidation or oxidative treatment as mentioned above is preferred for forming a less defective layer.

In the halftone phase shift mask blank of the invention, a second film of single layer or multilayer structure may be formed on the halftone phase shift film. Most often, the second film is disposed contiguous to the halftone phase shift film. Examples of the second film include a light-shielding film, a combination of light-shielding film and antireflective film, and an auxiliary film which functions as a hard mask during subsequent pattern formation of the halftone phase shift film. When a third film is formed as will be described later, the second film may be utilized as an auxiliary film (etching stop film) which functions as an etching stopper during subsequent pattern formation of the third film. The second film is preferably composed of a chromium-containing material.

One exemplary embodiment is a halftone phase shift mask blank illustrated in FIG. 2A. The halftone phase shift mask blank depicted at 100 in FIG. 2A includes a transparent substrate 10, a halftone phase shift film 1 formed on the substrate, and a second film 2 formed on the film 1.

The halftone phase shift mask blank may include a light-shielding film as the second film on the halftone phase shift film. A combination of a light-shielding film and an antireflective film may also be used as the second film. The provision of the second film including a light-shielding film ensures that a halftone phase shift mask includes a region capable of completely shielding exposure light. The light-shielding film and antireflective film may also be utilized as an auxiliary film during etching. The construction and material of the light-shielding film and antireflective film are known from many patent documents, for example, Patent Document 4 (JP-A 2007-033469) and Patent Document 5 (JP-A 2007-233179). One preferred film construction of the light-shielding film and antireflective film is a structure having a light-shielding film of Cr-containing material and an antireflective film of Cr-containing material for reducing reflection by the light-shielding film. Each of the light-shielding film and the antireflective film may be a single layer or multilayer. Suitable Cr-containing materials of which the light-shielding film and antireflective film are made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is a light-shielding film or a combination of a light-shielding film and an antireflective film, the light-shielding film is made of a chromium base material having a chromium content of at least 40 at %, especially at least 60 at % and less than 100 at %, preferably up to 99 at %, and more preferably up to 90 at %. The chromium base material has an oxygen content of at least 0 at % and up to 60 at %, preferably up to 40 at %, with an oxygen content of at least 1 at % being preferred when an etching rate must be adjusted. The chromium base material has a nitrogen content of at least 0 at % and up to 50 at %, preferably up to 40 at %, with a nitrogen content of at least 1 at % being preferred when an etching rate must be adjusted. The chromium base material has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a combination of a light-shielding film and an antireflective film, the antireflective film is preferably made of a chromium-containing material having a chromium content of preferably at least 30 at %, more preferably at least 35 at % and preferably up to 70 at %, and more preferably up to 50 at %. The chromium-containing material preferably has an oxygen content of up to 60 at %, and at least 1 at % and more preferably at least 20 at %. The chromium-containing material preferably has a nitrogen content of up to 50 at %, more preferably up to 30 at %, and at least 1 at %, more preferably at least 3 at %. The chromium-containing material preferably has a carbon content of at least 0 at % and up to 20 at %, more preferably up to 5 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a light-shielding film or a combination of a light-shielding film and an antireflective film, the second film has a thickness of typically 20 to 100 nm, preferably 40 to 70 nm. Also the halftone phase shift film combined with the second film should preferably have a total optical density of at least 2.0, more preferably at least 2.5, and even more preferably at least 3.0, with respect to exposure light of wavelength up to 200 nm.

In the halftone phase shift mask blank of the invention, a third film of single layer or multilayer structure may be formed on the second film. Most often, the third film is disposed contiguous to the second film. Examples of the third film include a light-shielding film, a combination of light-shielding film and antireflective film, and an auxiliary film which functions as a hard mask during subsequent pattern formation of the second film. The third film is preferably composed of a silicon-containing material, especially chromium-free silicon-containing material.

Figure 2B:
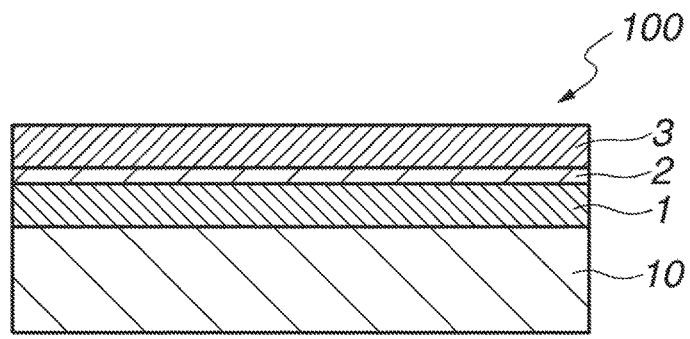

One exemplary embodiment is a halftone phase shift mask blank illustrated in FIG. 2B. The halftone phase shift mask blank depicted at 100 in FIG. 2B includes a transparent substrate 10, a halftone phase shift film 1 formed on the substrate, a second film 2 formed on the film 1, and a third film 3 formed on the second film 2.

Where the second film is a light-shielding film or a combination of a light-shielding film and an antireflective film, the third film may be an auxiliary film (etching mask film) which functions as a hard mask during subsequent pattern formation of the second film. When a fourth film is formed as will be described later, the third film may be utilized as an auxiliary film (etching stop film) which functions as an etching stopper during subsequent pattern formation of the fourth film. The auxiliary film is preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and one or both of nitrogen and oxygen, a material containing silicon and a transition metal, and a material containing silicon, one or both of nitrogen and oxygen, and a transition metal. Exemplary of the transition metal are molybdenum, tantalum and zirconium.

Where the third film is an auxiliary film, it is preferably composed of a silicon-containing material having a silicon content of preferably at least 20 at %, more preferably at least 33 at % and up to 95 at %, more preferably up to 80 at %. The silicon-containing material has a nitrogen content of at least 0 at % and up to 50 at %, preferably up to 30 at %, with a nitrogen content of at least 1 at % being preferred when an etching rate must be adjusted. The silicon-containing material has an oxygen content of at least 0 at %, preferably at least 20 at % and up to 70 at %, preferably up to 66 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is a light-shielding film or a combination of a light-shielding film and an antireflective film and the third film is an auxiliary film, the second film has a thickness of typically 20 to 100 nm, preferably 40 to 70 nm, and the third film has a thickness of typically 1 to 30 nm, preferably 2 to 15 nm. Also the halftone phase shift film combined with the second film should preferably have a total optical density of at least 2.0, more preferably at least 2.5, and even more preferably at least 3.0, with respect to exposure light of wavelength up to 200 nm.

Where the second film is an auxiliary film, a light-shielding film may be formed as the third film. Also, a combination of a light-shielding film and an antireflective film may be formed as the third film. Herein the second film may be utilized as an auxiliary film (etching mask film) which functions as a hard mask during pattern formation of the halftone phase shift film, or an auxiliary film (etching stop film) which functions as an etching stopper during pattern formation of the third film. Examples of the auxiliary film are films of chromium-containing materials as described in Patent Document 6 (JP-A 2007-241065). The auxiliary film may be a single layer or multilayer. Suitable chromium-containing materials of which the auxiliary film is made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is an auxiliary film, the film preferably has a chromium content of preferably at least 40 at %, more preferably at least 50 at % and up to 100 at %, more preferably up to 99 at %, and even more preferably up to 90 at %. The film has an oxygen content of at least 0 at %, and up to 60 at %, preferably up to 55 at %, with an oxygen content of at least 1 at % being preferred when an etching rate must be adjusted. The film has a nitrogen content of at least 0 at %, and up to 50 at %, preferably up to 40 at %, with a nitrogen content of at least 1 at % being preferred when an etching rate must be adjusted. The film has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

On the other hand, the light-shielding film and antireflective film as the third film are preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and nitrogen and/or oxygen, a material containing silicon and a transition metal, and a material containing silicon, nitrogen and/or oxygen, and a transition metal. Exemplary of the transition metal are molybdenum, tantalum and zirconium.

Where the third film is a light-shielding film or a combination of a light-shielding film and an antireflective film, the light-shielding film and antireflective film are preferably composed of a silicon-containing material having a silicon content of preferably at least 10 at %, more preferably at least 30 at % and less than 100 at %, more preferably up to 95 at %. The silicon-containing material has a nitrogen content of at least 0 at % and up to 50 at %, preferably up to 40 at %, especially up to 20 at %, with a nitrogen content of at least 1 at % being preferred when an etching rate must be adjusted. The silicon-containing material has an oxygen content of at least 0 at %, and up to 60 at %, preferably up to 30 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is an auxiliary film and the third film is a light-shielding film or a combination of a light-shielding film and an antireflective film, the second film has a thickness of typically 1 to 20 nm, preferably 2 to 10 nm, and the third film has a thickness of typically 20 to 100 nm, preferably 30 to 70 nm. Also the halftone phase shift film combined with the second and third films should preferably have a total optical density of at least 2.0, more preferably at least 2.5, and even more preferably at least 3.0, with respect to exposure light of wavelength up to 200 nm.

In the halftone phase shift photomask blank of the invention, a fourth film of single layer or multilayer structure may be formed on the third film. Most often, the fourth film is disposed contiguous to the third film. Exemplary of the fourth film is an auxiliary film which functions as a hard mask during subsequent pattern formation of the third film. The fourth film is preferably composed of a chromium-containing material.

Figure 2C:
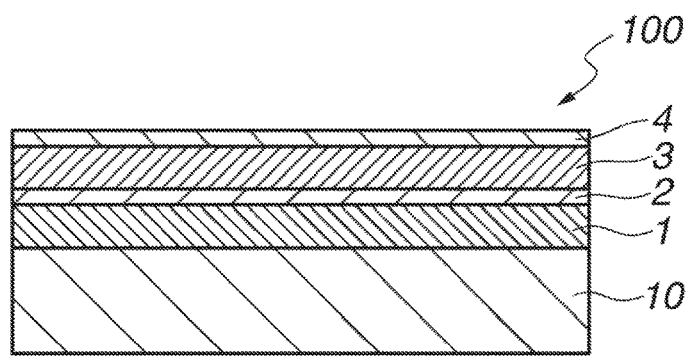

One exemplary embodiment is a halftone phase shift mask blank illustrated in FIG. 2C. The halftone phase shift mask blank depicted at 100 in FIG. 2C includes a transparent substrate 10, a halftone phase shift film 1 formed on the substrate, a second film 2 formed on the film 1, a third film 3 formed on the second film 2, and a fourth film 4 formed on the third film 3.

Where the third film is a light-shielding film or a combination of a light-shielding film and an antireflective film, the fourth film may be an auxiliary film (etching mask film) which functions as a hard mask during subsequent pattern formation of the third film. The auxiliary film is preferably composed of a material having different etching properties from the third film, for example, a material having resistance to fluorine dry etching applied to the etching of silicon-containing material, specifically a chromium-containing material which can be etched with oxygen-containing chloride gas. Suitable chromium-containing materials include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the fourth film is an auxiliary film, the film has a chromium content of at least 40 at %, preferably at least 50 at % and up to 100 at %, preferably up to 99 at %, and more preferably up to 90 at %. The film has an oxygen content of at least 0 at % and up to 60 at %, preferably up to 40 at %, with an oxygen content of at least 1 at % being preferred when an etching rate must be adjusted. The film has a nitrogen content of at least 0 at % and up to 50 at %, preferably up to 40 at %, with a nitrogen content of at least 1 at % being preferred when an etching rate must be adjusted. The film has a carbon content of at least 0 at % and up to 20 at %, preferably up to 10 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is an auxiliary film, the third film is a light-shielding film or a combination of a light-shielding film and an antireflective film, and the fourth film is an auxiliary film; the second film has a thickness of typically 1 to 20 nm, preferably 2 to 10 nm, the third film has a thickness of typically 20 to 100 nm, preferably 30 to 70 nm, and the fourth film has a thickness of typically 1 to 30 nm, preferably 2 to 20 nm. Also the halftone phase shift film combined with the second and third films should preferably have a total optical density of at least 2.0, more preferably at least 2.5, and even more preferably at least 3.0, with respect to exposure light of wavelength up to 200 nm.

The second and fourth films of chromium-containing materials may be deposited by reactive sputtering using a chromium target or a chromium target having one or more of oxygen, nitrogen and carbon added thereto, and a sputtering gas based on a rare gas such as Ar, He or Ne, to which a reactive gas selected from oxygen-containing gas, nitrogen-containing gas and carbon-containing gas is added depending on the desired composition of a film to be deposited.

The third film of silicon-containing material may be deposited by reactive sputtering using a silicon target, silicon nitride target, target containing silicon and silicon nitride, transition metal target, or composite silicon/transition metal target, and a sputtering gas based on a rare gas such as Ar, He or Ne, to which a reactive gas selected from oxygen-containing gas, nitrogen-containing gas and carbon-containing gas is added depending on the desired composition of a film to be deposited.

The mask blank may be processed into a mask by a standard technique. For example, a halftone phase shift mask blank comprising a halftone phase shift film and a second film of chromium-containing material deposited thereon may be processed as follows. First, a resist film adapted for electron beam (ED) lithography is formed on the second film of the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the second film, obtaining a pattern of the second film. Next, while the second film pattern is used as etching mask, fluorine base dry etching is carried out for transferring the pattern to the halftone phase shift film, obtaining a pattern of the halftone phase shift film. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift mask.

In another example, a halftone phase shift mask blank comprising a halftone phase shift film, a light-shielding film or a light-shielding film/antireflective film of chromium-containing material deposited thereon as a second film, and an auxiliary film of silicon-containing material deposited thereon as a third film may be processed as follows. First, a resist film adapted for EB lithography is formed on the third film of the halftone phase shift mask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, obtaining a pattern of the second film. The resist pattern is removed at this point. Further, while the second film pattern is used as etching mask, fluorine base dry etching is carried out for transferring the second film pattern to the halftone phase shift film to define a pattern of the halftone phase shift film and at the same time, removing the third film pattern. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift mask.

In a further example, a halftone phase shift mask blank comprising a halftone phase shift film, an auxiliary film of chromium-containing material deposited thereon as a second film, and a light-shielding film or a light-shielding film/antireflective film of silicon-containing material deposited on the second film as a third film may be processed as follows. First, a resist film adapted for EB lithography is formed on the third film of the halftone phase shift mask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, whereby a pattern of the second film is obtained, that is, a portion of the second film where the halftone phase shift film is to be removed is removed. The resist pattern is removed at this point. A resist pattern for protecting a portion of the third film to be left is formed on the third film. Further, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed, yielding a halftone phase shift mask.

In a still further example, a halftone phase shift mask blank comprising a halftone phase shift film, an auxiliary film of chromium-containing material deposited thereon as a second film, a light-shielding film or a light-shielding film/antireflective film of silicon-containing material deposited on the second film as a third film, and an auxiliary film of chromium-containing material deposited on the third film as a fourth film may be processed as follows. First, a resist film adapted for EB lithography is formed on the fourth film of the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the fourth film, obtaining a pattern of the fourth film. While the fourth film pattern thus obtained is used as etching mask, fluorine base dry etching is carried out for transferring the fourth film pattern to the third film, obtaining a pattern of the third film. The resist pattern is removed at this point. A resist pattern for protecting a portion of the third film to be left is formed on the fourth film. Further, while the third film pattern is used as etching mask, oxygen-containing chlorine base dry etching is carried out for transferring the third film pattern to the second film, obtaining a pattern of the second film and at the same time, removing the portion of the fourth film which is not protected with the resist pattern. Next, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed and the portion of the fourth film where the resist pattern has been removed, yielding a halftone phase shift mask.

In a photolithographic method for forming a pattern with a half pitch of up to 50 nm, typically up to 30 nm, and more typically up to 20 nm on a processable substrate, comprising the steps of forming a photoresist film on the processable substrate and exposing the photoresist film to light of wavelength up to 200 nm, typically ArF excimer laser (193 nm) or F, laser (157 nm), through a patterned mask for transferring the pattern to the photoresist film, the halftone phase shift mask of the invention is best suited for use in the exposure step.

EXAMPLE

Examples are given below for further illustrating the invention although the invention is not limited thereto.

Example 1

On a quartz substrate of 152 mm squares and 6.35 mm thick, a halftone phase shift film of SiN was deposited by reactive sputtering using a silicon target as the sputtering target, and nitrogen and argon gases as the sputtering gas. The deposition time was adjusted such that the film might have a phase shift of 178° with respect to light of wavelength 193 nm (ArF excimer laser, same hereinafter). Then the film had a transmittance of 6% with respect to light of wavelength 193 nm and a thickness of 61 nm. On X-ray photoelectron spectroscopy (XPS), the film had a Si:N atomic ratio of 48:52 and a transition metal content of up to 0.1 at %.

Next, on the halftone phase shift film, a light-shielding film of CrON was deposited by sputtering using a chromium target as the sputtering target, and nitrogen, oxygen and argon gases as the sputtering gas. The light-shielding film was deposited to a thickness of 45 nm, yielding a halftone phase shift mask blank. Next, a resist film for EB lithography was formed on the light-shielding film. The resist film was processed by EB lithography to form a resist pattern. With the resist pattern made etching mask, the light-shielding film was patterned by chlorine base dry etching to form a light-shielding film pattern. With the light-shielding film pattern made etching mask, the halftone phase shift film was etched by fluorine base dry etching to form a halftone phase shift film pattern having a line width of 200 nm. Finally the resist film pattern was removed, yielding a halftone phase shift mask.

In a clean air atmosphere of 25° C. and humidity 45%, the halftone phase shift mask thus obtained was irradiated with light of wavelength 193 nm having a pulse frequency of 1.6 kHz and a pulse energy of 2.5 to 4.0 mJ/cm$^2$ until the cumulative irradiation energy dose reached 40 kJ/cm$^2$. An exposure system ArFES-3500PM (Litho Tech Japan Corp.) and an ArF excimer laser light source IndyStar (Coherent GmbH) were used. The line width of the halftone phase shift film pattern before and after irradiation of light of wavelength 193 nm was measured under a scanning electron microscope LWM9045 (Vistec). The pattern size variation before and after irradiation of 193 nm light was as small as 0.7 nm.

Example 2

On a quartz substrate of 152 mm squares and 6.35 mm thick, a halftone phase shift film of SiN was deposited by reactive sputtering using a silicon target as the sputtering target, and nitrogen and argon gases as the sputtering gas. The deposition time was adjusted such that the film might have a phase shift of 180° with respect to light of wavelength 193 nm. Then the film had a transmittance of 12% with respect to light of wavelength 193 nm and a thickness of 60 nm. On XPS analysis, the film had a Si:N atomic ratio of 47:53 and a transition metal content of up to 0.1 at %.

As in Example 1, a light-shielding film was deposited on the halftone phase shift film, yielding a halftone phase shift mask blank. By following the same procedure as in Example 1 including formation of a resist film for EB lithography and etching, a halftone phase shift mask was obtained. Next, the halftone phase shift mask was irradiated with light of wavelength 193 nm as in Example 1. The line width of the halftone phase shift film pattern before and after irradiation of light of wavelength 193 nm was measured. The pattern size variation before and after irradiation of 193 nm light was as small as 0.6 nm.

Example 3

On a quartz substrate of 152 mm squares and 6.35 mm thick, a halftone phase shift film of SiON was deposited by reactive sputtering using a silicon target as the sputtering target, and nitrogen, oxygen and argon gases as the sputtering gas. The deposition time was adjusted such that the film might have a phase shift of 177° with respect to light of wavelength 193 nm. Then the film had a transmittance of 19% with respect to light of wavelength 193 nm and a thickness of 60 nm. On XPS analysis, the film had a Si:N:O atomic ratio of 45:53:2 and a transition metal content of up to 0.1 at %.

As in Example 1, a light-shielding film was deposited on the halftone phase shift film, yielding a halftone phase shift mask blank. By following the same procedure as in Example 1 including formation of a resist film for EB lithography and etching, a halftone phase shift mask was obtained. Next, the halftone phase shift mask was irradiated with light of wavelength 193 nm as in Example 1. The line width of the halftone phase shift film pattern before and after irradiation of light of wavelength 193 nm was measured. The pattern size variation before and after irradiation of 193 nm light was as small as 0.7 nm.

Example 4

On a quartz substrate of 152 mm squares and 6.35 mm thick, a halftone phase shift film of MoSiN was deposited by reactive sputtering using silicon and molybdenum/silicon targets as the sputtering target, and nitrogen and argon gases as the sputtering gas. The deposition time was adjusted such that the film might have a phase shift of 176° with respect to light of wavelength 193 nm. Then the film had a transmittance of 4% with respect to light of wavelength 193 nm and a thickness of 60 nm. On XPS analysis, the film had a Si:N atomic ratio of 47:52 and a transition metal content of 0.9 at %.

As in Example 1, a light-shielding film was deposited on the halftone phase shift film, yielding a halftone phase shift mask blank. By following the same procedure as in Example 1 including formation of a resist film for EB lithography and etching, a halftone phase shift mask was obtained. Next, the halftone phase shift mask was irradiated with light of wavelength 193 nm as in Example 1. The line width of the halftone phase shift film pattern before and after irradiation of light of wavelength 193 nm was measured. The pattern size variation before and after irradiation of 193 nm light was as small as 0.5 nm.

Comparative Example 1

On a quartz substrate of 152 mm squares and 6.35 mm thick, a halftone phase shift film of MoSiON was deposited by reactive sputtering using a silicon target and a target containing molybdenum and silicon in a molar ratio of 1:2 as the sputtering target, and nitrogen, oxygen and argon gases as the sputtering gas. The deposition time was adjusted such that the film might have a phase shift of 177° with respect to light of wavelength 193 nm. Then the film had a transmittance of 6% with respect to light of wavelength 193 nm and a thickness of 75 nm. On XPS analysis, the film had a Si:N:O atomic ratio of 36:45:10 and a Mo content of 9 at %.

As in Example 1, a light-shielding film was deposited on the halftone phase shift film, yielding a halftone phase shift mask blank. By following the same procedure as in Example 1 including formation of a resist film for EB lithography and etching, a halftone phase shift mask was obtained. Next, the halftone phase shift mask was irradiated with light of wavelength 193 nm as in Example 1. The line width of the halftone phase shift film pattern before and after irradiation of light of wavelength 193 nm was measured. The pattern size variation before and after irradiation of 193 nm light was as large as 26.7 nm.

Comparative Example 2

On a quartz substrate of 152 mm squares and 6.35 mm thick, a halftone phase shift film of MoSiON was deposited by reactive sputtering using a silicon target and a target containing molybdenum and silicon in a molar ratio of 1:2 as the sputtering target, and nitrogen, oxygen and argon gases as the sputtering gas. The deposition time was adjusted such that the film might have a phase shift of 177° with respect to light of wavelength 193 nm. Then the film had a transmittance of 6% with respect to light of wavelength 193 nm and a thickness of 72 nm. On XPS analysis, the film had a Si:N:O atomic ratio of 36:42:14 and a Mo content of 9 at %.

As in Example 1, a light-shielding film was deposited on the halftone phase shift film, yielding a halftone phase shift mask blank. By following the same procedure as in Example 1 including formation of a resist film for EB lithography and etching, a halftone phase shift mask was obtained. Next, the halftone phase shift mask was irradiated with light of wavelength 193 nm as in Example 1. The line width of the halftone phase shift film pattern before and after irradiation of light of wavelength 193 nm was measured. The pattern size variation before and after irradiation of 193 nm light was as large as 20.6 nm.

It has been demonstrated that a halftone phase shift film pattern having a transition metal content of up to 1 at % experiences a minimal pattern size variation degradation of less than 1 nm before and after irradiation of 193 nm light in a cumulative irradiation dose of 40 kJ/cm$^2$. This suggests that a halftone phase shift mask having such a halftone phase shift film pattern has a long lifetime. According to the invention, there is obtained a halftone phase shift mask blank or halftone phase shift mask having a halftone phase shift film having a thickness of up to 70 nm which is amenable to processing into a photomask pattern and experiences a minimal pattern size variation degradation upon exposure to 193 nm light.

Japanese Patent Application No. 2015-072658 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A halftone phase shift mask blank comprising a transparent substrate and a halftone phase shift film thereon having a phase shift of 150° to 200° and a transmittance of 3% to 30% with respect to light of wavelength up to 200 nm, wherein said halftone phase shift film is a single layer or a multilayer film, each layer comprising silicon and nitrogen and oxygen, when the halftone phase shift film is a single layer, the overall single layer is composed of a silicon base material, or when the halftone phase shift film is a multilayer film, at least 60% of its thickness is composed of a silicon base material, said silicon base material having a total content of silicon, nitrogen and oxygen of at least 90 at %, a silicon content of 30 to 70 at %, a total content of nitrogen and oxygen of 30 to 60 at %, an oxygen content of up to 2 at %, and a transition metal content of 0.01 to 0.9 at %, and said halftone phase shift film has a thickness of up to 70 nm.

2. The mask blank of claim 1 wherein the halftone phase shift film has a transmittance of 20% to 30%, and said silicon base material contains oxygen and has a total content of silicon, nitrogen and oxygen of at least 95 at %.

3. The mask blank of claim 1, further comprising a second film on the halftone phase shift film, the second film being a single layer or a multilayer film composed of a chromium-containing material.

4. The mask blank of claim 3 wherein the second film is a light-shielding film, a combination of light-shielding film and antireflective film, or an auxiliary film which functions as a hard mask during pattern formation of the halftone phase shift film.

5. The mask blank of claim 3, further comprising a third film on the second film, the third film being a single layer or a multilayer film composed of a silicon-containing material.

6. The mask blank of claim 5 wherein the second film is a light-shielding film or a combination of light-shielding film and antireflective film, and the third film is an auxiliary film which functions as a hard mask during pattern formation of the second film.

7. The mask blank of claim 5 wherein the second film is an auxiliary film which functions as a hard mask during pattern formation of the halftone phase shift film and as an etch stopper during pattern formation of the third film, and the third film is a light-shielding film or a combination of light-shielding film and antireflective film.

8. The mask blank of claim 5, further comprising a fourth film on the third film, the fourth film being a single layer or a multilayer film composed of a chromium-containing material.

9. The mask blank of claim 8 wherein the second film is an auxiliary film which functions as a hard mask during pattern formation of the halftone phase shift film and as an etch stopper during pattern formation of the third film, the third film is a light-shielding film or a combination of light-shielding film and antireflective film, and the fourth film is an auxiliary film which functions as a hard mask during pattern formation of the third film.

10. A halftone phase shift mask prepared from the halftone phase shift mask blank of claim 1.

11. The mask blank of claim 1 wherein the oxygen content of the silicon base material is up to 1 at %.

12. A halftone phase shift mask blank comprising a transparent substrate and a halftone phase shift film thereon having a phase shift of 150° to 200° and a transmittance of 3% to 30% with respect to light of wavelength up to 200 nm, wherein said halftone phase shift film is a single layer or a multilayer film, each layer comprising silicon and nitrogen, when the halftone phase shift film is a single layer, the overall single layer is composed of a silicon base material, or when the halftone phase shift film is a multilayer film, at least 60% of its thickness is composed of a silicon base material being free of oxygen, said silicon base material having a total content of silicon and nitrogen of at least 90 at %, a silicon content of 30 to 70 at %, a nitrogen content of 40 to 60 at %, and a transition metal content of 0.01 to 0.9 at %, and said halftone phase shift film has a thickness of up to 70 nm.

13. The mask blank of claim 12 wherein the halftone phase shift film has a transmittance of 3% to less than 20%, and said silicon base material has a total content of silicon and nitrogen of at least 95 at %.

14. The mask blank of claim 12, further comprising a second film on the halftone phase shift film, the second film being a single layer or a multilayer film composed of a chromium-containing material.

15. The mask blank of claim 14 wherein the second film is a light-shielding film, a combination of light-shielding film and antireflective film, or an auxiliary film which functions as a hard mask during pattern formation of the halftone phase shift film.

16. The mask blank of claim 14, further comprising a third film on the second film, the third film being a single layer or a multilayer film composed of a silicon-containing material.

17. The mask blank of claim 16 wherein the second film is a light-shielding film or a combination of light-shielding film and antireflective film, and the third film is an auxiliary film which functions as a hard mask during pattern formation of the second film.

18. The mask blank of claim 16 wherein the second film is an auxiliary film which functions as a hard mask during pattern formation of the halftone phase shift film and as an etch stopper during pattern formation of the third film, and the third film is a light-shielding film or a combination of light-shielding film and antireflective film.

19. The mask blank of claim 16, further comprising a fourth film on the third film, the fourth film being a single layer or a multilayer film composed of a chromium-containing material.

20. The mask blank of claim 19 wherein the second film is an auxiliary film which functions as a hard mask during pattern formation of the halftone phase shift film and as an etch stopper during pattern formation of the third film, the third film is a light-shielding film or a combination of light-shielding film and antireflective film, and the fourth film is an auxiliary film which functions as a hard mask during pattern formation of the third film.

21. A halftone phase shift mask prepared from the halftone phase shift mask blank of claim 12.

* * * * *